(12) United States Patent
Yamashita et al.

(10) Patent No.: US 11,978,743 B2
(45) Date of Patent: May 7, 2024

(54) TFT ARRAY SUBSTRATE AND DISPLAY PANEL INCLUDING THE SAME

(71) Applicant: Everdisplay Optronics (Shanghai) Co., Ltd., Shanghai (CN)

(72) Inventors: Keitaro Yamashita, Shanghai (CN); Yoshihiro Morimoto, Shanghai (CN)

(73) Assignee: Everdisplay Optronics (Shanghai) Co., Ltd, Shanghai (CN)

( * ) Notice: Subject to any disclaimer, the term of this patent is extended or adjusted under 35 U.S.C. 154(b) by 253 days.

(21) Appl. No.: 17/524,295

(22) Filed: Nov. 11, 2021

(65) Prior Publication Data

US 2022/0173133 A1 Jun. 2, 2022

(30) Foreign Application Priority Data

Dec. 1, 2020 (CN) .......................... 202011383263.7
Dec. 1, 2020 (CN) .......................... 202022837227.5

(51) Int. Cl.
*H01L 27/12* (2006.01)
*H01L 23/00* (2006.01)
*H01L 25/18* (2023.01)

(52) U.S. Cl.
CPC .......... *H01L 27/1248* (2013.01); *H01L 24/05* (2013.01); *H01L 24/29* (2013.01);
(Continued)

(58) Field of Classification Search
CPC ... H01L 27/124; H01L 27/1248; H01L 24/05; H01L 27/1259; H01L 24/83; H01L 24/32;
(Continued)

(56) References Cited

U.S. PATENT DOCUMENTS

2002/0145694 A1* 10/2002 Jang ..................... G02F 1/13452
349/138
2006/0181218 A1* 8/2006 Jung ................... G02F 1/13458
313/631
(Continued)

*Primary Examiner* — Mouloucoulaye Inoussa
(74) *Attorney, Agent, or Firm* — Qinghong Xu

(57) ABSTRACT

The present disclosure relates to a TFT array substrate and a display panel including the same. The TFT array substrate includes a first substrate and a circuit layer disposed on a side of the first substrate; wherein the circuit layer comprises a first electrode layer, an insulating layer, a first pad layer, and a planarization layer; the first electrode layer comprises a plurality of first electrodes disposed on the side of the first substrate, and the first electrodes are electrodes of thin film transistors in the TFT array substrate; the insulating layer is disposed on a side of the first electrode layer away from the first substrate; the first pad layer comprises a plurality of first pads disposed on a side of the insulating layer away from the first electrode layer; the plurality of first pads are electrically connected to the plurality of first electrodes through contact holes respectively penetrating the insulating layer; the planarization layer is disposed on the side of the insulating layer away from the first electrode layer; the insulating layer is provided with a plurality of trenches, and a projection of each of the trenches on the first substrate respectively covers a projection of a corresponding edge of the first pads on the first substrate.

17 Claims, 4 Drawing Sheets

(52) U.S. Cl.
CPC .............. *H01L 24/32* (2013.01); *H01L 25/18* (2013.01); *H01L 27/1259* (2013.01); *H01L 2224/05073* (2013.01); *H01L 2224/05082* (2013.01); *H01L 2224/05558* (2013.01); *H01L 2224/05573* (2013.01); *H01L 2224/2929* (2013.01); *H01L 2224/29339* (2013.01); *H01L 2224/29344* (2013.01); *H01L 2224/32145* (2013.01)

(58) Field of Classification Search
CPC ... H01L 24/29; H01L 25/18; H01L 23/49838; H01L 24/16; H01L 23/49811; H01L 24/73; H01L 24/04; H01L 27/1225; H01L 2224/29344; H01L 2224/04026; H01L 2224/2929; H01L 2224/83851; H01L 2224/29339; H01L 2224/05558; H01L 2224/05082; H01L 2224/32145; H01L 2224/05599; H01L 2224/05073; H01L 2224/05573; H01L 2224/83201; H01L 2924/00014; H01L 2924/0635; H01L 2924/0665; H01L 2224/81439; H01L 2224/81438; H01L 2224/2939; H01L 2224/294; H01L 2224/81486; H01L 2224/16227; H01L 2224/29199; H01L 2224/13099; H01L 2224/81411; H01L 2224/8148; H01L 2224/81424; H01L 2224/16237; H01L 2224/0221; H01L 2224/02145; H01L 2224/16148; H10K 59/40; H10K 59/131; H10K 50/844; H10K 77/111; H10K 59/1201; H10K 59/88; H10K 2102/341; H10K 2102/311; G06F 3/044; G06F 3/04164; G06F 3/0443; G06F 3/0412; G06F 3/0446; G06F 2203/04102; G06F 2203/04111; G06F 2203/04103; Y02P 70/50; H05K 1/111; H05K 1/0259; H05K 2201/09381; Y02E 10/549; G02F 1/13458; G02F 1/136286; G02F 1/136227; G02F 1/13452; G02F 1/133512; G02F 1/136295; G02F 1/133514; G02F 1/1368
USPC ........ 257/43; 438/23; 361/749, 767; 29/825; 349/151, 138, 43; 345/206

See application file for complete search history.

(56) References Cited

U.S. PATENT DOCUMENTS

| | | | | |
|---|---|---|---|---|
| 2006/0244893 | A1* | 11/2006 | Oda | G02F 1/13452 349/151 |
| 2013/0120329 | A1* | 5/2013 | Wang | G02F 1/13452 345/206 |
| 2014/0140019 | A1* | 5/2014 | Park | H05K 3/361 361/767 |
| 2015/0187803 | A1* | 7/2015 | Moh | H01L 27/1225 438/23 |
| 2018/0269269 | A1* | 9/2018 | Kim | G06F 3/0446 |
| 2020/0135813 | A1* | 4/2020 | Lee | H10K 59/40 |
| 2020/0363895 | A1* | 11/2020 | Shim | H10K 59/40 |
| 2020/0395286 | A1* | 12/2020 | Hsu | H01L 23/49838 |

* cited by examiner

US 11,978,743 B2

TFT ARRAY SUBSTRATE AND DISPLAY PANEL INCLUDING THE SAME

TECHNICAL FIELD

The present disclosure relates to the field of display panels, in particular to a TFT array substrate and a display panel including the same.

BACKGROUND

A thin film transistor circuit used in displays may include a pad, a buffer layer, an insulating layer, and a planarization layer (PLN). The planarization layer can be patterned by a photolithography to form one or more contact hole at a metal electrode, and the pad electrically connected to the metal electrode below the contact hole can be formed at the contact hole by patterning with the photolithography.

The above-mentioned pad may be electrically connected to an electrode under a driver integrated circuit (IC) or a flexible printed circuit (FPC) formed on a substrate through an anisotropic conductive film (ACF).

In order to prevent the metal electrode under the pad from being exposed to etchant used to etch the pad on top of the metal electrode, the pad covers the metal electrode underneath. In this case, a thicker planarization layer is required, however, due to the fluidity on a surface of the planarization layer, it may cover an edge of the pad, so that the surface of the pad is relatively lower than the surface of the planarization layer, which makes the bonding pressure between the electrode under the driver IC or the flexible printed circuit (FPC) and the pad may not be concentrated on the pad, but will spread to other areas, such as planarization layer, except for the pad. When the pressure between the electrode under the driver IC or the flexible printed circuit (FPC) and the pad is insufficient, it will cause poor contact between the two or even fatal contact failure.

It should be noted that the information disclosed in the above background section is only used to enhance the understanding of the background of the present invention, and therefore may include information that does not constitute the prior art known to those of ordinary skill in the art.

SUMMARY

The embodiments of the present disclosure provide a thin film transistor (TFT) array substrate. The thin film transistor (TFT) array substrate may include a first substrate and a circuit layer disposed on a side of the first substrate; wherein the circuit layer includes a first electrode layer, an insulating layer, a first pad layer, and a planarization layer; the first electrode layer includes a plurality of first electrodes disposed on the side of the first substrate, and the first electrodes are electrodes of thin film transistors in the TFT array substrate; the insulating layer is disposed on a side of the first electrode layer away from the first substrate; the first pad layer includes a plurality of first pads disposed on a side of the insulating layer away from the first electrode layer; the plurality of first pads are electrically connected to the plurality of first electrodes through contact holes respectively penetrating the insulating layer; the planarization layer is disposed on the side of the insulating layer away from the first electrode layer; the insulating layer is provided with a plurality of trenches, and a projection of each of the trenches on the first substrate respectively covers a projection of a corresponding edge of the first pads on the first substrate.

The embodiments of the present disclosure further provide a display panel. The display panel includes the TFT array substrate mentioned above. Furthermore, the display panel includes a circuit driving device. The circuit driving device may include a second substrate; a driving circuit disposed on a side of the second substrate; a second pad layer comprising a plurality of second pads disposed on other side of the second substrate, and each of the second pads being led out from an electrode of the driving circuit; and an anisotropic conductive film layer, wherein chips of the driving circuit and the TFT array substrate are encapsulated by using the anisotropic conductive film layer.

BRIEF DESCRIPTION OF THE DRAWINGS

The drawings herein are incorporated into the specification and constitute a part of the specification, show embodiments consistent with the present disclosure and together with the specification are used to explain the principle of the disclosure. By reading the detailed description of the non-limiting embodiments with reference to the following drawings, other features, purposes and advantages of the present disclosure will become more apparent. Obviously, the drawings in the following description are only some embodiments of the present disclosure, For those of ordinary skill in the art, other drawings can be obtained based on these drawings without creative work.

REFERENCE NUMBER

Figure 1:
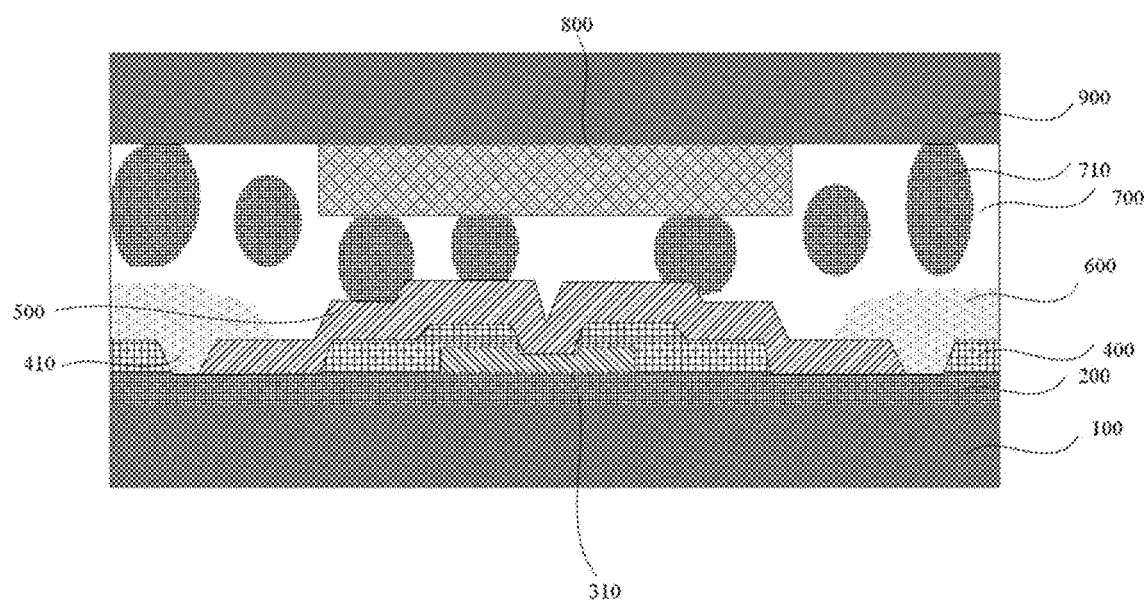
FIG. 1 is a schematic structure diagram of a TFT array substrate according to some embodiments of the present disclosure.

100 First Substrate
200 Buffer Layer
310 First Electrode Layer
320 Second Electrode Layer
400 Insulating Layer
410 Trench
420 Polysilicon Layer
500 First Pad Layer
600 Planarization Layer
700 Anisotropic Conductive Film
710 Conductive Particles
800 Second Pad Layer
900 Second Substrate

DETAILED DESCRIPTION

Example embodiments will now be described more fully with reference to the accompanying drawings. However, the example embodiments can be implemented in various forms, and should not be construed as being limited to the examples set forth herein. On the contrary, the provision of these embodiments makes the present disclosure more comprehensive and complete, and fully conveys the concept of the example embodiments to those skilled in the art. The described features, structures or characteristics can be combined in one or more embodiments in any suitable way.

In addition, the drawings are only schematic illustrations of the present disclosure, and are not necessarily drawn to scale. The same reference numerals in the figures denote the same or similar parts, and thus their repeated description will be omitted. Some of the block diagrams shown in the drawings are functional entities and do not necessarily correspond to physically or logically independent entities.

In view of the problems in the prior art, the purpose of the present disclosure is to provide a thin film transistor (TFT) array substrate and a display panel including the same. The TFT array substrate is provided with trenches on the insulating layer so that the planarization layer does not cover the first pads, which reduces a height difference between the planarization layer and the first pads. In case of this TFT array substrate being used in a display panel, when the TFT array substrate is encapsulated with the circuit driving device, there is no height difference between the planarization layer and the pad, so the electrical connection performance of the circuit driving device and the TFT array substrate will not be affected.

FIG. 1 is a schematic structural diagram of a TFT array substrate according to some embodiments of the present disclosure. Specifically, the TFT array substrate may include a first substrate 100 and a circuit layer disposed on one side of the first substrate 100.

The circuit layer may include a first electrode layer 310, an insulating layer 400, a first pad layer 500, and a planarization layer 600.

The first electrode layer 310 may include a plurality of first electrodes disposed on one side of the first substrate 100, and the first electrodes are electrodes of thin film transistors in the TFT array substrate.

In some embodiments, as shown in the embodiment of FIG. 1, a buffer layer 200 may be disposed between the first electrode layer 310 and the first substrate 100.

The insulating layer 400 is disposed on a side of the first electrode layer 310 and said side is away from the first substrate 100. The insulating layer may include multiple dielectric layers, such as a first insulating layer and a second insulating layer composed of two dielectric layers, etc.

The first pad layer 500 may include a plurality of first pads, which are disposed on a side of the insulating layer 400 away from the first electrode layer 310.

It should be noted that the descriptions in FIGS. 1 to 4 all take only one pad and related structure on the first substrate as an example. The first pads are electrically connected to the first electrodes through contact holes respectively penetrating the insulating layer 400.

The planarization layer 600 is disposed on the side of the insulating layer 400 away from the first electrode layer 310;

The insulating layer 400 is provided with a plurality of trenches 410, and a projection of each of trenches 410 on the first substrate 100 respectively covers a projection of a corresponding edge of the first pads on the first substrate 100.

The first electrode layer 310, the insulating layer 400, the first pad layer 500, etc. may all adopt a patterning process. The patterning process may include a photolithography process or both of a photolithography process and an etching step, and may also include printing, inkjet and other processes used to form a predetermined pattern. The photolithography process refers to a process that forms a pattern by using photoresist, a mask, an exposure machine, etc., and may include film formation, exposure, development and other processes. The corresponding patterning process can be selected according to the structure formed in the present disclosure.

In the TFT array substrate of the present disclosure, when the planarization layer 600 is prepared, trenches 410 are provided at the edge of the first pad, and the planarization layer 600 fills the trenches 410 due to its fluidity, thereby reducing the covering for the edge of the first pad, so that the height of the planarization layer at the edge of the first pad is not greater than that of the first pad, which solves the problem that the planarization layer is higher than the pad in the prior art. In the case that the TFT array substrate is used in the display panel, there is no height difference between the planarization layer and the pad, when encapsulating with the circuit driving device, and thus the electrical connection performance between the circuit driving device and the TFT array substrate will not be affected or not be reduced.

In some embodiments, the depth of the trench 410 is between 50 nm and 500 nm. Preferably, the depth of the trench 410 is 100 nm, 200 nm, or 400 nm. The width of the trench 410 is between 1 μm and 500 μm. For example, the width of the trench 410 may be 1 μm, 10 μm, 50 μm, 100 μm, 200 μm or 400 μm. The depth and width of the trenches can be set according to the thickness of the actual planarization layer. The greater the thickness of the planarization layer, the greater the depth or width of the corresponding trenches.

Figure 2:
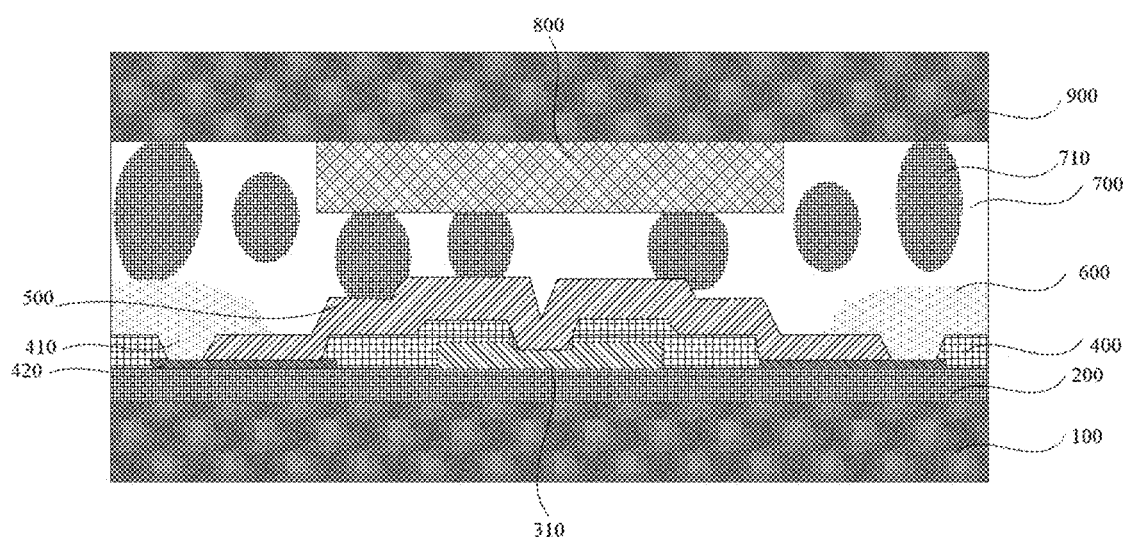
FIG. 2 is a schematic structure diagram of a TFT array substrate according to some embodiments of the present disclosure.

Since the trenches are obtained by etching the insulating layer 400 via a patterning process, in order to prevent the etching process from affecting the buffer layer 200 under the insulating layer 400, the TFT array substrate further includes a polysilicon layer 420. As shown in FIG. 2, the polysilicon layer 420 may include a plurality of polysilicon film blocks disposed at the bottom of the trenches 410. That is, before the insulating layer 400 is deposited, the patterning process is used to deposit the polysilicon film blocks in the corresponding areas of the trenches, thereby limiting the depth of the trenches, so that the preparation process of the trenches will not damage buffer layer 200.

The projections of the trenches on the first substrate 100 fall into the projections of the polysilicon film blocks on the first substrate 100, which means that the polysilicon film blocks are larger than the width of the trenches 410.

In some embodiments, the thickness of the polysilicon layer is between 20 nm and 100 nm.

Other embodiments of the present disclosure also provide a display panel including the above-mentioned TFT array substrate.

According to some examples of the present disclosure, the display panel further includes a circuit driving device, and the circuit driving device includes: a second substrate 900; a driving circuit disposed on a side of the second substrate 900; a second pad layer 800; and an anisotropic conductive film layer 700. The second pad layer 800 may include a plurality of second pads disposed on other side of the second substrate 900, and each of the second pads is led out from an electrode of the driving circuit. The chips of the driving circuit and the TFT array substrate are encapsulated by the anisotropic conductive film layer 700.

The material of the anisotropic conductive film layer 700 may be a non-conductive material (such as epoxy resin, acrylate, etc.) mixed with conductive particles 710 (conductive gold particles, conductive silver particles, etc.). The second pad of the circuit driving device of the present disclosure and the first pad of the TFT array substrate are electrically connected through the conductive particles 710 of the anisotropic conductive film layer 700.

The circuit driving device of the present disclosure may include a power driving chip, a TFT control chip, a TFT column data driving chip, and the like.

The first substrate and the second substrate of the present disclosure may be flexible or rigid. The flexible substrate or cover-plate may have a structure with a single-layer or multi-layer flexible film. The flexible film may be made of polyimide (PI), polyethylene terephthalate (PET), polyethylene naphthalate (PBN) or polycarbonate and other flexible substrate materials, or be made of metal foil and other materials. The multilayer flexible film structure may be a multilayer PI film, or a multilayer PET film, or a multilayer film structure in which PI films and PET are alternately laminated.

The second pad of the circuit driving device of the present disclosure and the first pad of the TFT array substrate apply pressure through the first substrate and the second substrate. Since trenches 410 are provided on the insulating layer 400 at the edge of the first pad 500, the height of the planarization layer 600 at the edge of the first pad 500 is not greater than that of the first pad 500. At this time, the bonding pressure between the first substrate and the second substrate may be concentrated on the first pad and the second pad, which effectively reduces poor electrical contact or even fatal electrical contact failure between them due to the insufficient pressure between the first pad and the second pad. The display panel of the present disclosure greatly improves the electrical connection performance of the circuit driving device and the TFT array substrate, ensures the reliability of the driving signal, and improves the yield rate of the display panel.

Figure 3:
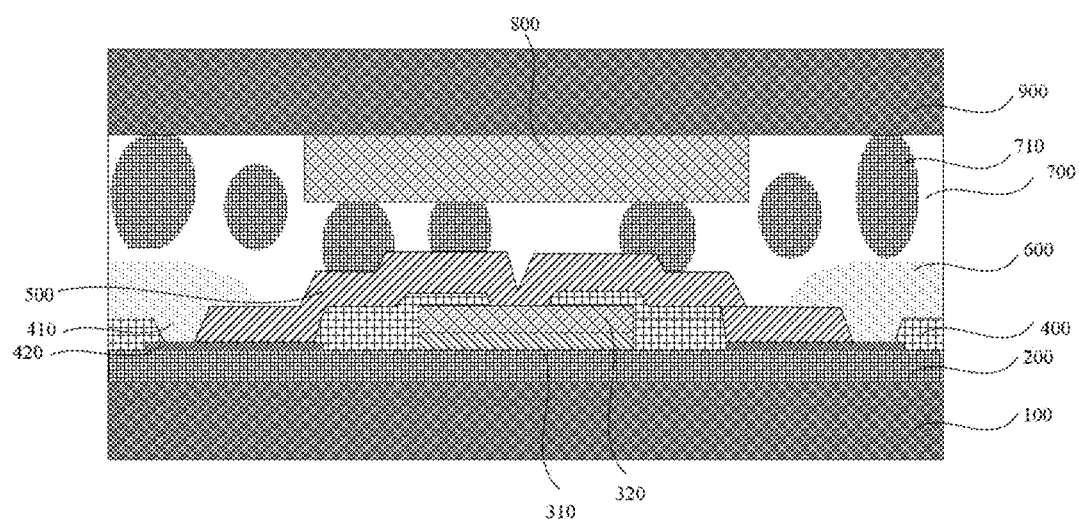
FIG. 3 is a schematic structural diagram of a TFT array substrate according to some embodiments of the present disclosure.
Figure 4:
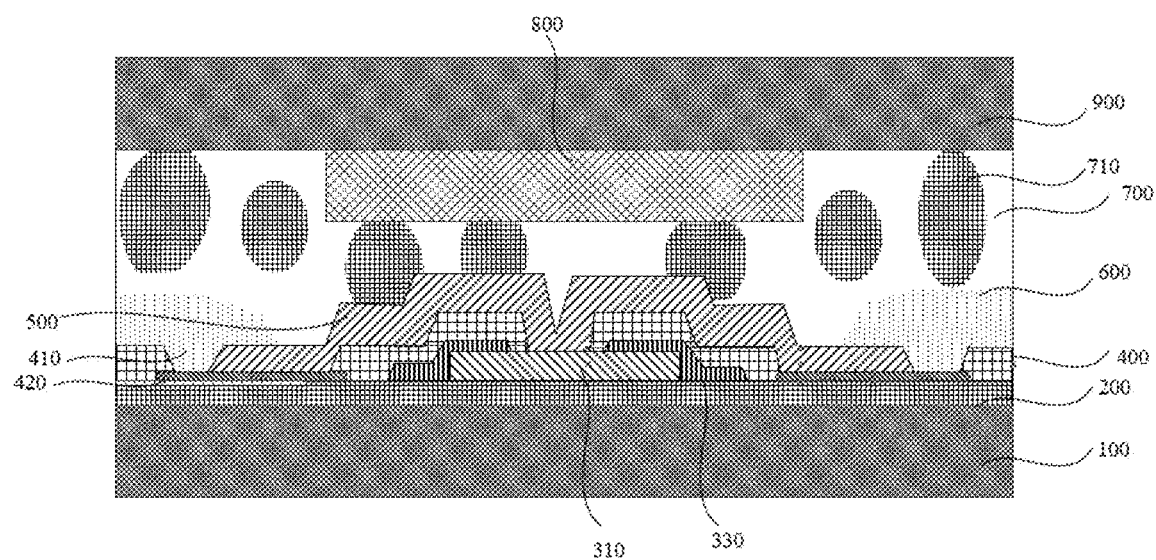
FIG. 4 is a schematic structural diagram of a TFT array substrate according to some embodiments of the present disclosure.

In order to further improve the first pads and the second pads, that is, further improve the electrical connection performance between the circuit driving device and the TFT array substrate, in some embodiments, the TFT array substrate may further include a second electrode layer 320, which includes a plurality of second electrodes, as shown in FIG. 3. The second electrode layer 320 is disposed on the side of the first electrode layer 310 away from the first substrate 100. The projections of the second electrodes on the first substrate 100 are overlapped with the projections of the first electrodes on the first substrate 100, and the first electrodes, the second electrodes and the first pads are electrically connected to each other. In this embodiment, the second electrodes can effectively increase the thickness at the first electrodes, thereby reducing the distance between the first pads and the second pads, increasing the bonding pressure between the first pads and the second pads, and further improving electrical contact performance of both.

Preferably, the thickness of the second electrode layer 320 is between 200 nm and 500 nm.

In order to further improve the electrical connection performance of the first pads and the second pads, that is, the electrical connection performance of the circuit driving device and the TFT array substrate, in other embodiments, the TFT array substrate may further include a functional layer 330, which includes multiple functional blocks. The functional layer 330 may be composed of a non-conductive material. The projections of the functional blocks on the first substrate 100 are overlapped with the projections of the first electrodes on the first substrate 100. The electrical connection between the first pads and the first electrodes is achieved through contact holes respectively penetrating the insulating layer 400 and the functional blocks. Similarly, the functional layer 330 can effectively increase the thickness at the first electrodes, thereby reducing the distance between the first pads and the second pads, increasing the bonding pressure between the first pads and the second pads, thereby further improving the electrical contact performance of both.

In some embodiments, the thickness of the functional layer 330 is between 200 nm and 500 nm.

The present disclosure may include embodiments having both the second electrode layer and the functional layer.

In summary, the present disclosure provides a TFT array substrate and a display panel including the same. The TFT array substrate includes trenches disposed on the insulating layer 400, so that the planarization layer does not cover the first pads, reducing the height difference between the planarization layer and the first pads used for electrical connection. Furthermore, the display panel having the TFT array substrate of the present disclosure reduces the contact failure caused by the height difference between the planarization layer in the TFT array substrate and the first pads, greatly improves the electrical connection performance between the circuit driving device and the TFT array substrate, ensures the reliability of the driving signal, and further improves the yield rate of the display panel.

The TFT array substrate is provided with trenches on the insulating layer so that the planarization layer does not cover the first pads, which reduces a height difference between the planarization layer and the first pads. The display panel including the TFT array substrate of the present disclosure reduces the contact failure caused by the height difference between the planarization layer in the TFT array substrate and the first pad, greatly improves the electrical connection performance between the circuit driving device and the TFT array substrate, ensures the reliability of the driving signal, and further improves the yield rate of the display panel.

The above content is a further detailed description of the present disclosure in combination with specific preferred embodiments, and it cannot be considered that the specific implementation of the present disclosure is limited to these descriptions. For those skilled in the art, it is obvious that the present disclosure is not limited to the details of the foregoing exemplary embodiments, and the present disclosure can be implemented in other specific forms without departing from the spirit or basic characteristics thereof. Therefore, no matter from which point of view, the embodiments should be regarded as exemplary and non-limiting. The scope of the present disclosure is defined by the appended claims rather than the above description, and therefore all changes fall into the meaning and scope of the equivalent elements of the claims are included in the present disclosure. Any reference signs in the claims should not be regarded as limiting the claims involved. In addition, it is obvious that the word 'including' or 'comprising' does not exclude other units or steps, and the singular does not exclude the plural. Multiple units or devices stated in the device claims can also be implemented by one unit or device through software or hardware. It should be understood that terms such as 'under' or 'on', 'down' or 'up' are used to describe the features of the exemplary embodiment at the positions shown in the figures, and the terms such as 'first' and 'second' are used to indicate names, but not to indicate any particular order.

What is claimed is:

1. A thin film transistor (TFT) array substrate, comprising:
   a first substrate and a circuit layer disposed on a side of the first substrate;
   wherein the circuit layer comprises a first electrode layer, an insulating layer, a first pad layer, and a planarization layer;
   the first electrode layer comprises a plurality of first electrodes disposed on the side of the first substrate, and the first electrodes are electrodes of thin film transistors in the TFT array substrate;

the insulating layer is disposed on a side of the first electrode layer away from the first substrate;

the first pad layer comprises a plurality of first pads disposed on a side of the insulating layer away from the first electrode layer;

the plurality of first pads are electrically connected to the plurality of first electrodes through contact holes respectively penetrating the insulating layer;

the planarization layer is disposed on the side of the insulating layer away from the first electrode layer;

the insulating layer is provided with a plurality of trenches, and a projection of each of the trenches on the first substrate respectively covers a projection of a corresponding edge of the first pads on the first substrate, wherein the TFT array substrate further comprises a polysilicon layer, the polysilicon layer comprising a plurality of polysilicon film blocks; and wherein projections of the trenches on the first substrate fall into projections of the polysilicon film blocks on the first substrate.

2. The TFT array substrate according to claim 1, wherein a depth of the trenches is between 50 nm and 500 nm.

3. The TFT array substrate according to claim 1, wherein a width of the trenches is between 1 μm and 500 μm.

4. The TFT array substrate according to claim 1, wherein a thickness of the polysilicon layer is between 20 nm and 100 nm.

5. The TFT array substrate according to claim 1, further comprising a second electrode layer, and the second electrode layer comprising a plurality of second electrodes;

wherein the second electrode layer is disposed on the side of the first electrode layer away from the first substrate;

projections of the second electrodes on the first substrate overlap with projections of the first electrodes on the first substrate;

the first electrodes, the second electrodes and the first pads are electrically connected to each other.

6. The TFT array substrate according to claim 5, wherein a thickness of the second electrode layer is between 200 nm and 500 nm.

7. The TFT array substrate according to claim 1, further comprising a functional layer, and the functional layer comprising a plurality of functional blocks;

wherein projections of the functional blocks on the first substrate overlap with projections of the first electrodes on the first substrate;

the first pads are electrically connected to the first electrodes through contact holes respectively penetrating the insulating layer and the functional blocks.

8. The TFT array substrate according to claim 7, wherein a thickness of the functional layer is between 200 nm and 500 nm.

9. A display panel, comprising a thin film transistor (TFT) array substrate, the TFT array substrate comprising a first substrate and a circuit layer disposed on a side of the first substrate, wherein the circuit layer comprises a first electrode layer, an insulating layer, a first pad layer, and a planarization layer;

the first electrode layer comprises a plurality of first electrodes disposed on the side of the first substrate, and the first electrodes are electrodes of thin film transistors in the TFT array substrate;

the insulating layer is disposed on a side of the first electrode layer away from the first substrate;

the first pad layer comprises a plurality of first pads disposed on a side of the insulating layer away from the first electrode layer;

the plurality of first pads are electrically connected to the plurality of first electrodes through contact holes respectively penetrating the insulating layer;

the planarization layer is disposed on the side of the insulating layer away from the first electrode layer;

the insulating layer is provided with a plurality of trenches, and a projection of each of the trenches on the first substrate respectively covers a projection of a corresponding edge of the first pads on the first substrate, wherein the TFT array substrate further comprises a polysilicon layer, the polysilicon layer comprising a plurality of polysilicon film blocks; and wherein projections of the trenches on the first substrate fall into projections of the polysilicon film blocks on the first substrate.

10. The display panel according to claim 9, further comprising a circuit driving device, and the circuit driving device comprising:

a second substrate;

a driving circuit disposed on a side of the second substrate;

a second pad layer comprising a plurality of second pads disposed on other side of the second substrate, and each of the second pads being led out from an electrode of the driving circuit; and an anisotropic conductive film layer, wherein chips of the driving circuit and the TFT array substrate are encapsulated by using the anisotropic conductive film layer.

11. The display panel according to claim 9, wherein a depth of the trenches is between 50 nm and 500 nm.

12. The display panel according to claim 9, wherein a width of the trenches is between 1 μm and 500 μm.

13. The display panel according to claim 9, wherein a thickness of the polysilicon layer is between 20 nm and 100 nm.

14. The display panel according to claim 9, further comprising a second electrode layer, and the second electrode layer comprising a plurality of second electrodes;

wherein the second electrode layer is disposed on the side of the first electrode layer away from the first substrate;

projections of the second electrodes on the first substrate overlap with projections of the first electrodes on the first substrate;

the first electrodes, the second electrodes and the first pads are electrically connected to each other.

15. The display panel according to claim 14, wherein a thickness of the second electrode layer is between 200 nm and 500 nm.

16. The display panel according to claim 9, further comprising a functional layer, and the functional layer comprising a plurality of functional blocks;

wherein projections of the functional blocks on the first substrate overlap with projections of the first electrodes on the first substrate;

the first pads are electrically connected to the first electrodes through contact holes respectively penetrating the insulating layer and the functional blocks.

17. The display panel according to claim 16, wherein a thickness of the functional layer is between 200 nm and 500 nm.

* * * * *